(12) United States Patent
Nazarian et al.

(10) Patent No.: US 7,894,267 B2
(45) Date of Patent: Feb. 22, 2011

(54) DETERMINISTIC PROGRAMMING ALGORITHM THAT PROVIDES TIGHTER CELL DISTRIBUTIONS WITH A REDUCED NUMBER OF PROGRAMMING PULSES

(75) Inventors: Hagop Nazarian, San Jose, CA (US); Michael Achter, Mountain View, CA (US); Harry Kuo, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 646 days.

(21) Appl. No.: 11/929,741

(22) Filed: Oct. 30, 2007

(65) Prior Publication Data

US 2009/0109760 A1    Apr. 30, 2009

(51) Int. Cl.
*G11C 11/34*    (2006.01)
*G11C 16/04*    (2006.01)
(52) U.S. Cl. .............................. 365/185.19; 365/185.24; 365/185.29
(58) Field of Classification Search ............ 365/185.19, 365/185.28
See application file for complete search history.

(56) References Cited

U.S. PATENT DOCUMENTS

| | | | | |
|---|---|---|---|---|
| 5,905,675 | A * | 5/1999 | Madurawe et al. | 365/185.18 |
| 6,301,151 | B1 * | 10/2001 | Engh et al. | 365/185.03 |
| 2008/0232172 | A1 * | 9/2008 | Kang | 365/185.22 |

* cited by examiner

*Primary Examiner*—Ly D Pham
(74) *Attorney, Agent, or Firm*—Turocy & Watson, LLP

(57) ABSTRACT

Systems and methods for improving the programming of memory devices. A pulse component applies different programming pulses to a memory cell. An analysis component measures values of one or more characteristics of the memory cell as a function of the applied different programming pulses. A computation component computes the applied different programming pulses as a function of the measured values of the one or more characteristics of the memory cell. The analysis component measures one or more values of the one or more characteristics of the memory cell, the computation component computes one or more programming pulses as a function of the one or more measured values of the one or more characteristics of the memory cell, and the pulse component applies the one or more programming pulses to the memory cell.

20 Claims, 10 Drawing Sheets

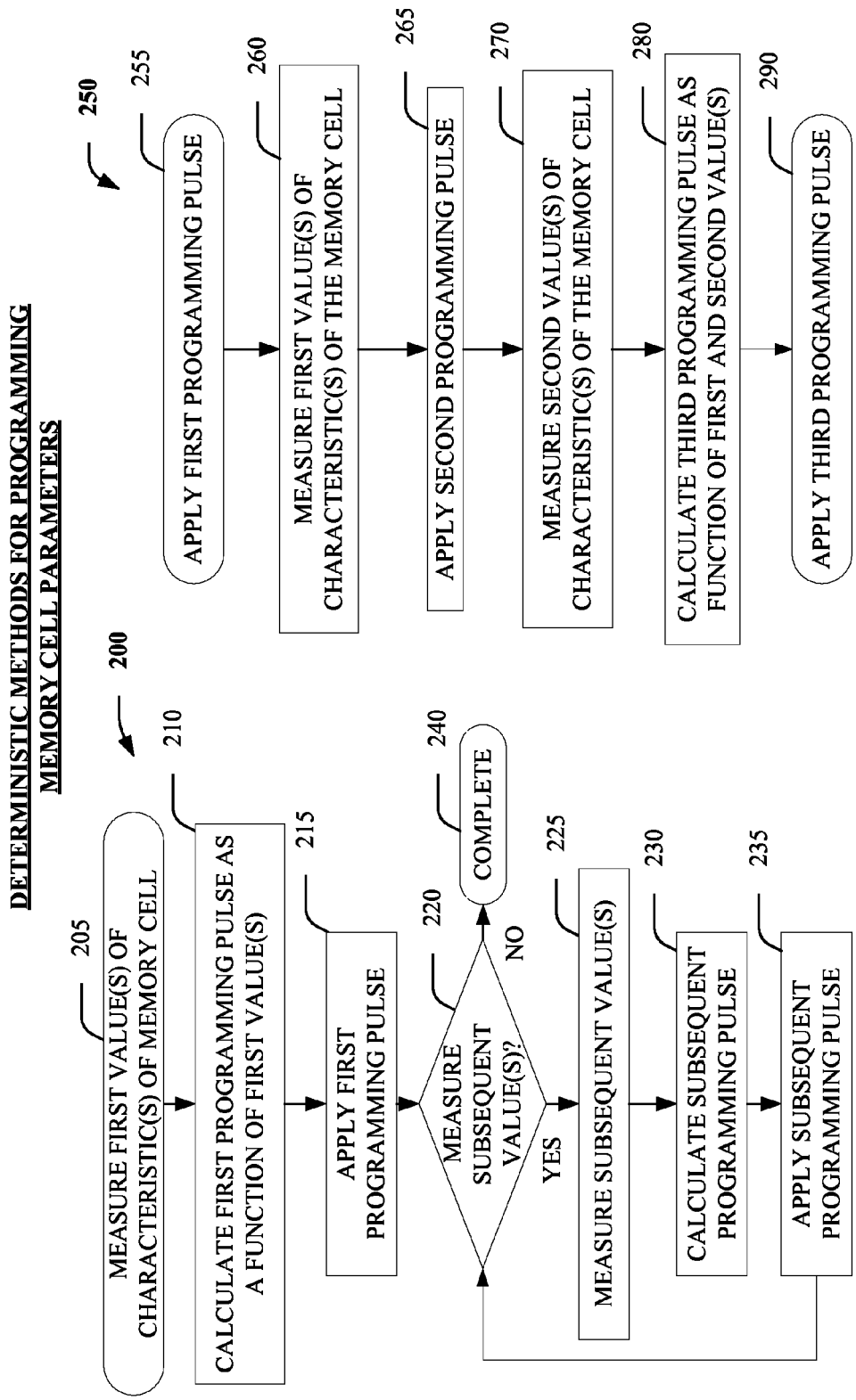

DETERMINISTIC PROGRAMMING ALGORITHM THAT PROVIDES TIGHTER CELL DISTRIBUTIONS WITH A REDUCED NUMBER OF PROGRAMMING PULSES

TECHNICAL FIELD

This disclosure relates generally to systems for programming memory devices and in particular, but not exclusively, relates to systems for programming memory devices that provide tighter cell distributions with a reduced number of programming pulses.

BACKGROUND

A wide variety of memory devices can be used to maintain and store data and instructions for various computers and similar systems, including non-volatile memory devices that do not require power to retain information (e.g., EPROM, EEPROM, and Flash memory).

The performance of a memory device can be controlled by programming parameters of memory cells contained in the memory device (e.g., programming gain, threshold voltage, and drain current). Traditionally, memory cell parameters are programmed by applying fixed programming pulses to a memory cell. FIG. 10 is a flow chart illustrating a conventional process 1000 for programming memory cell parameters. In a process block 1005, a fixed programming pulse is applied to a memory cell one or more times. Process 1000 then continues to a decision block 1010, in which it is determined whether the memory cell parameter programmed successfully.

If the memory cell parameter programmed successfully, process 1000 continues to a process block 1020, in which it is determined that the memory cell programmed successfully. If the memory cell parameter did not program successfully, process 1000 continues to a decision block 1015, in which it is determined whether to cease programming. If programming is not ceased, process 1000 continues to process block 1005, in which the fixed programming pulse is applied to the memory cell one or more times. If programming is ceased, process 1000 continues to a process block 1025, in which it is determined that memory cell programming failed.

One concern with programming memory cell parameters is non-deterministic and extended programming time, which is caused by process variations in the manufacture of a memory device. Such process variations may require applying additional fixed programming pulses to one or more memory cells of the memory device, extending the programming time of the memory device.

Another concern with programming memory cell parameters is device stress caused by applying multiple fixed programming pulses to a memory cell in order to program one or more of its parameters; these multiple fixed programming pulses can breakdown various physical layers of the memory cell (e.g., dielectric layers) and lead to memory device failure. Over programming is another concern with programming memory cell parameters, which occurs, e.g., when a memory cell is programmed to a higher threshold voltage than desired after applying multiple fixed programming pulses to the memory cell. Yet another concern with programming memory cell parameters is wide memory cell distributions that occur as a result of applying fixed programming pulses to memory cells of a memory device, which results in less control over the performance of the memory device (e.g., when over programming occurs).

It is therefore desirable to have systems and methods that improve the programming performance of memory devices, i.e., reduce memory cell programming time, increase memory device reliability, reduce memory cell over programming, and tighten memory cell distributions.

SUMMARY

The claimed subject matter relates to systems and methods for deterministically programming memory cell parameters to achieve faster programming times, increased device reliability, no or minimal over programming, and tighter memory cell distributions. Due to process variations in the manufacture of memory devices, conventional systems and methods limit memory device programming performance by applying a different number of fixed programming pulses to different memory cells of a memory device, and/or by applying excessive programming pulses to a memory cell of the memory device.

In accordance with aspects described herein, deterministic programming reduces memory device programming time because it adaptively determines individual programming pulses applied to individual memory cells of a memory device, iteratively converging on a desired programmed parameter in as little as one programming pulse. Moreover, unlike present programming technology, which increases device stress and can lead to device failure (e.g., breakdown of dielectric layers) by applying multiple fixed programming pulses to program memory cells, the novel systems and methods of the present invention reduce device stress and increase device reliability by tailoring successive programming pulses applied to each memory cell of a memory device.

Aspects of the present invention include improved control over memory device performance since tighter memory cell distributions are achieved through deterministic programming. Compared to traditional programming technology that results in varied memory cell parameter distributions and over programming due to fixed programming pulses applied to each memory cell of a memory device, deterministic programming tightens memory cell distributions and reduces or eliminates over programming by iteratively converging on a desired programmed parameter value for each memory cell of a memory device.

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The subject invention provides systems and methods that improve the programming performance of memory devices. In accordance with one aspect of the disclosed subject matter, a pulse component can be employed to apply different programming pulses to a memory cell. An analysis component can be employed to measure values of one or more characteristics of the memory cell as a function of the applied different programming pulses, and a computation component can be employed to compute the applied different programming pulses as a function of the measured values of the one or more characteristics of the memory cell.

In accordance with another aspect of the disclosed subject matter, an analysis component measures first values of one or more characteristics of a memory cell, a computation component computes a first programming pulse as a function of the measured first values of the one or more characteristics of the memory cell, and a pulse component applies the first programming pulse to the memory cell. In yet another aspect of the disclosed subject matter, the analysis component measures one or more subsequent values of the one or more characteristics of the memory cell, the computation component computes one or more subsequent programming pulses as a function of the measured one or more subsequent values of the one or more characteristics of the memory cell, and the pulse component applies the one or more subsequent programming pulses to the memory cell.

In accordance with one aspect of the disclosed subject matter, an analysis component measures first and second values of one or more characteristics of a memory cell as a function of a first programming pulse and a second programming pulse applied to the memory cell, the second programming pulse different from the first programming pulse. Further, a computation component computes a third programming pulse as a function of the measured first and second values of the one or more characteristics of the memory cell. Finally, the third programming pulse, different from the second programming pulse, is applied to the memory cell.

In accordance with another aspect of the disclosed subject matter, a pulse component applies one or more subsequent programming pulses to a memory cell. An analysis component measures subsequent values of the one or more characteristics of the memory cell as a function of the one or more subsequent programming pulses applied to the memory cell. Further, a computation component computes the one or more subsequent programming pulses as a function of the measured subsequent values of the one or more characteristics of the memory cell.

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 2A is a flow chart illustrating a process for deterministically programming memory cell parameters, in accordance with an embodiment of the invention.

FIG. 2B is a flow chart illustrating a process for deterministically programming memory cell parameters, in accordance with an embodiment of the invention.

DETAILED DESCRIPTION

Embodiments of systems and methods that improve the programming performance of memory devices by deterministically programming memory cell parameters are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
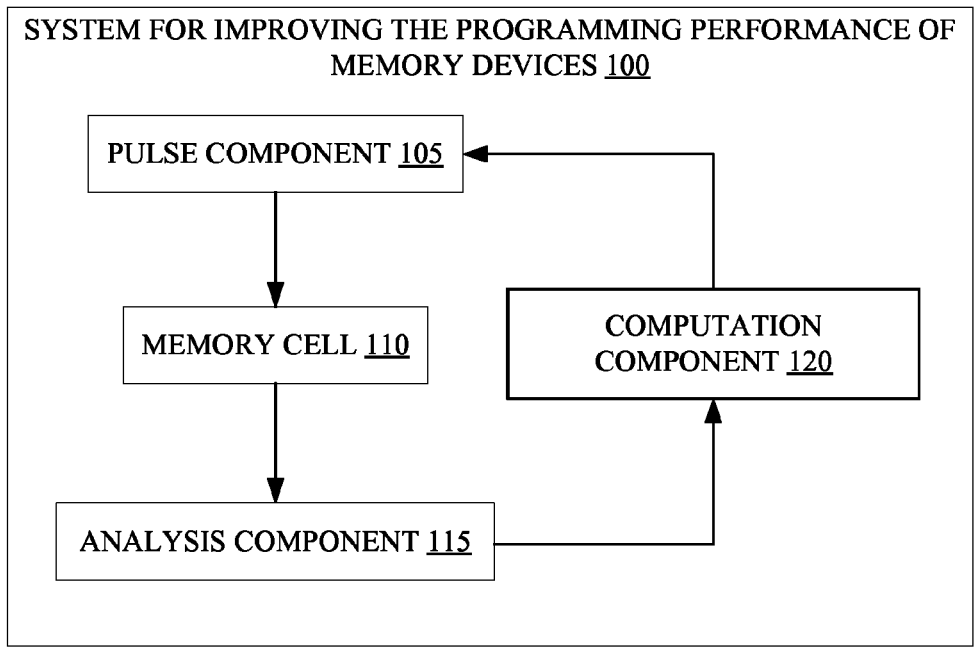
FIG. 1A is a demonstrative system for improving the programming performance of memory devices, in accordance with an embodiment of the invention.

Embodiments of the invention include techniques for reducing memory cell programming time, increasing memory device reliability, reducing memory cell over programming, and tightening memory cell distributions. FIG. 1A is a demonstrative system 100 for improving the programming performance of memory devices, in accordance with an embodiment of the invention. System 100 and the systems and processes explained below may constitute machine-executable instructions embodied within a machine (e.g., computer) readable medium, which when executed by a machine will cause the machine to perform the operations described. Additionally, the systems and processes may be embodied within hardware, such as an application specific integrated circuit ("ASIC") or the like. The order in which some or all of the process blocks appear in each process should not be deemed limiting. Rather, it should be understood by a person of ordinary skill in the art having the benefit of the instant disclosure that some of the process blocks may be executed in a variety of orders not illustrated.

In system 100, a pulse component 105 can apply different programming pulses to a memory cell 110. An analysis component 115 can measure values of one or more characteristics of the memory cell as a function of the applied different programming pulses, and a computation component 120 can compute the applied different programming pulses as a function of the measured values of the one or more characteristics of the memory cell. In accordance with one embodiment, the memory cell can be a flash memory cell (e.g., single-bit flash memory, multi-bit flash memory) that includes at least one of a NOR flash memory or a NAND flash memory. In accordance with other embodiments, the memory cell can be any other type of non-volatile memory cell. Unlike conventional programming systems and methods, which are non-deterministic and/or extend the programming time of a memory device by applying fixed programming pulses to memory cells of the memory device, the subject invention reduces memory device programming time by adaptively determining individual programming pulses applied to individual memory cells of the memory device.

Figure 1B:
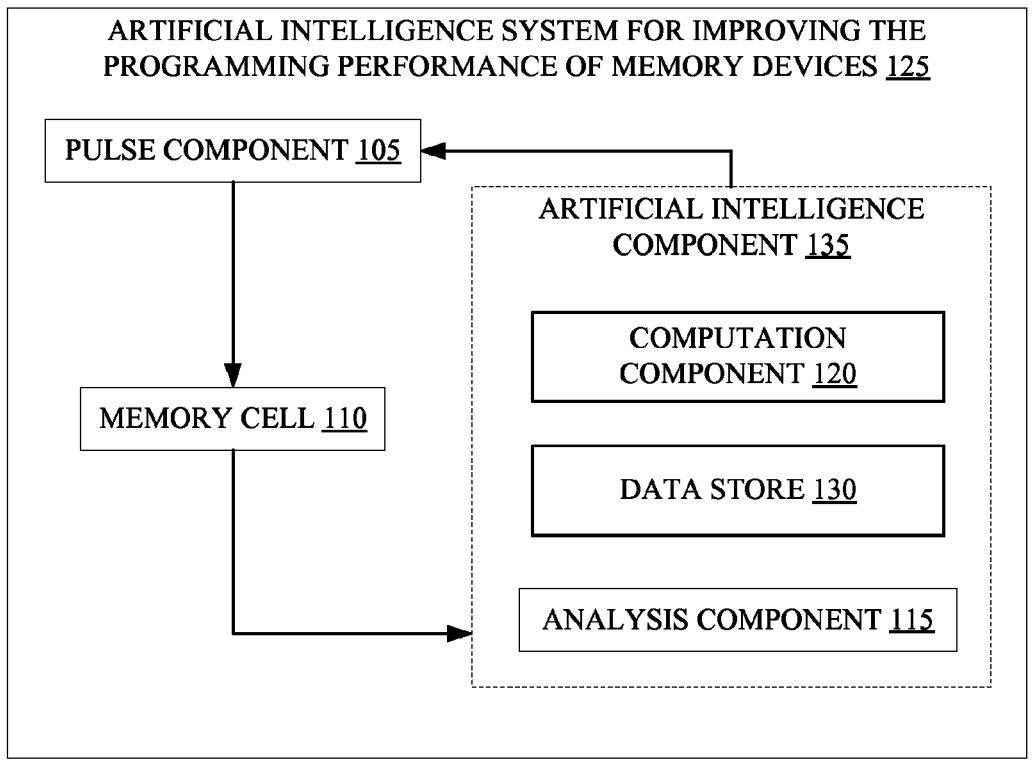
FIG. 1B is a demonstrative artificial intelligence based system for improving the programming performance of memory devices, in accordance with an embodiment of the invention.

Further, unlike conventional programming systems and methods that apply programming pulses to memory cells in excess of what would otherwise be required to program a particular parameter, the subject invention reduces memory device stress by tailoring successive programming pulses applied to each memory cell of a memory device. FIG. 1B is a demonstrative artificial intelligence based system 125 for improving the programming performance of memory devices, in accordance with an embodiment of the invention. Artificial intelligence system 125 can contain an artificial intelligence component 135, in which a data store component 130 can store information and a computation component 120 can automatically compute applied different programming pulses as a function of the information stored by data store component 130.

In one embodiment of system 100, data store component 130 can contain one or more look-up tables. In another embodiment of system 100, look-up tables contained in data store component 130 can contain values of characteristics or parameters of the memory cell. In yet another embodiment, artificial intelligence based system 125 is a closed-loop feedback system that automatically computes applied different programming pulses based on values measured by an analysis component and information retrieved from one or more look-up tables. Further, in another embodiment of system 100, data store component 130 can contain a calculation component, which can manipulate data (e.g., performing functions of an encoder and/or decoder).

FIG. 2A is a flow chart illustrating a process 200 for deterministically programming memory cell parameters, in accordance with an embodiment of the invention. In one embodiment, the memory cell parameter that can be programmed is memory cell threshold voltage. In other embodiments, the memory cell parameters that can be programmed include memory cell gain or drain current. However, it should be appreciated that any parameter of the memory cell can be programmed. In a process block 205, analysis component 115 can measure first value(s) of one or more characteristics of a memory cell. Process 200 can then continue to a process block 210, in which computation component 120 can calculate a first programming pulse as a function of the measured first value(s) of the one or more characteristics of the memory cell. In accordance with one embodiment, the characteristics of the memory cell that can be measured include the threshold voltage of the memory cell. In other embodiments, the characteristic of the memory cell that can be measured is memory cell gain, body effect, drain voltage, source voltage, substrate voltage, well voltage, resistance, drain current, programming current, well current, or temperature coefficient. However, it should be appreciated that any characteristic of the memory cell can be measured.

Process 200 can then continue to a process block 215, in which pulse component 105 can apply the first programming pulse. Next, process 200 can continue to a decision block 220, in which it can be determined whether to measure subsequent values of the one or more parameters of the memory cell. If it is decided that subsequent values will not be measured, process 200 can be completed in termination block 240, otherwise, process 200 can continue to a process block 225, in which analysis component 115 can measure subsequent values of the one or more characteristics of the memory cell. Next, process 200 can continue to a process block 230, in which computation component 120 can calculate a subsequent programming pulse as a function of the measured subsequent value(s) of the one or more characteristics of the memory cell. Process 200 can then continue to a process block 235, in which pulse component 105 can apply the subsequent programming pulse. From process block 235, process 200 can continue to decision block 220, in which it can be decided whether to measure subsequent values of the one or more characteristics of the memory cell.

FIG. 2B is a flow chart illustrating a process 250 for deterministically programming memory cell parameters, in accordance with an embodiment of the invention. In a process block 255, pulse component 105 can apply a first programming pulse to a memory cell. Process 250 can then continue to a process block 260, in which analysis component 115 can measure first value(s) of one or more characteristics of the memory cell. In accordance with one embodiment, the characteristics of the memory cell that can be measured include the threshold voltage of the memory cell. In other embodiments, the characteristic of the memory cell that can be measured is memory cell gain, body effect, drain voltage, source voltage, substrate voltage, well voltage, resistance, drain current, programming current, well current, or temperature coefficient. However, it should be appreciated that any characteristic of the memory cell can be measured.

Process 250 can then continue to a process block 265, in which pulse component 105 can apply a second programming pulse to the memory cell, different from the first programming pulse. Next, process 250 can continue to a process block 270, in which analysis component 115 can measure second value(s) of the one or more characteristics of the memory cell. Process 250 can then continue to a process block 280, in which computation component 120 can calculate a third programming pulse, different from the first and second programming pulses, based on the first value(s) of the one or more characteristics that were measured at process block 260 and the second value(s) of the one or more characteristics that were measured at process block 270. Next, process 200 can continue to a process block 290, in which pulse component 105 can apply the third programming pulse to the memory cell. By applying different programming pulses to a memory cell and computing the applied different programming pulses as a function of measured values of a characteristic of the memory cell, the subject invention can iteratively converge to a desired programmed parameter in as little as one programming pulse.

In accordance with one embodiment, pulse component 105 can vary the magnitude of the voltage of the first, second, and third programming pulses as a function of the measured values of a characteristic of a memory cell. In other embodiments, pulse component 105 can vary the magnitude of the pulse current, electric field, width, and/or shape (i.e., over time) of the first, second, and third programming pulses as a function of the measured values of a characteristic of a memory cell. However, it should be appreciated that the programming pulses can differ in any way. Further, in accordance with one embodiment, the programming pulses can be applied to the drain of the memory cell. In other embodiments, the programming pulses can be applied to the gate or source of the memory cell. However, it should be appreciated that the programming pulses can be applied to any part of the memory cell.

Figure 3:
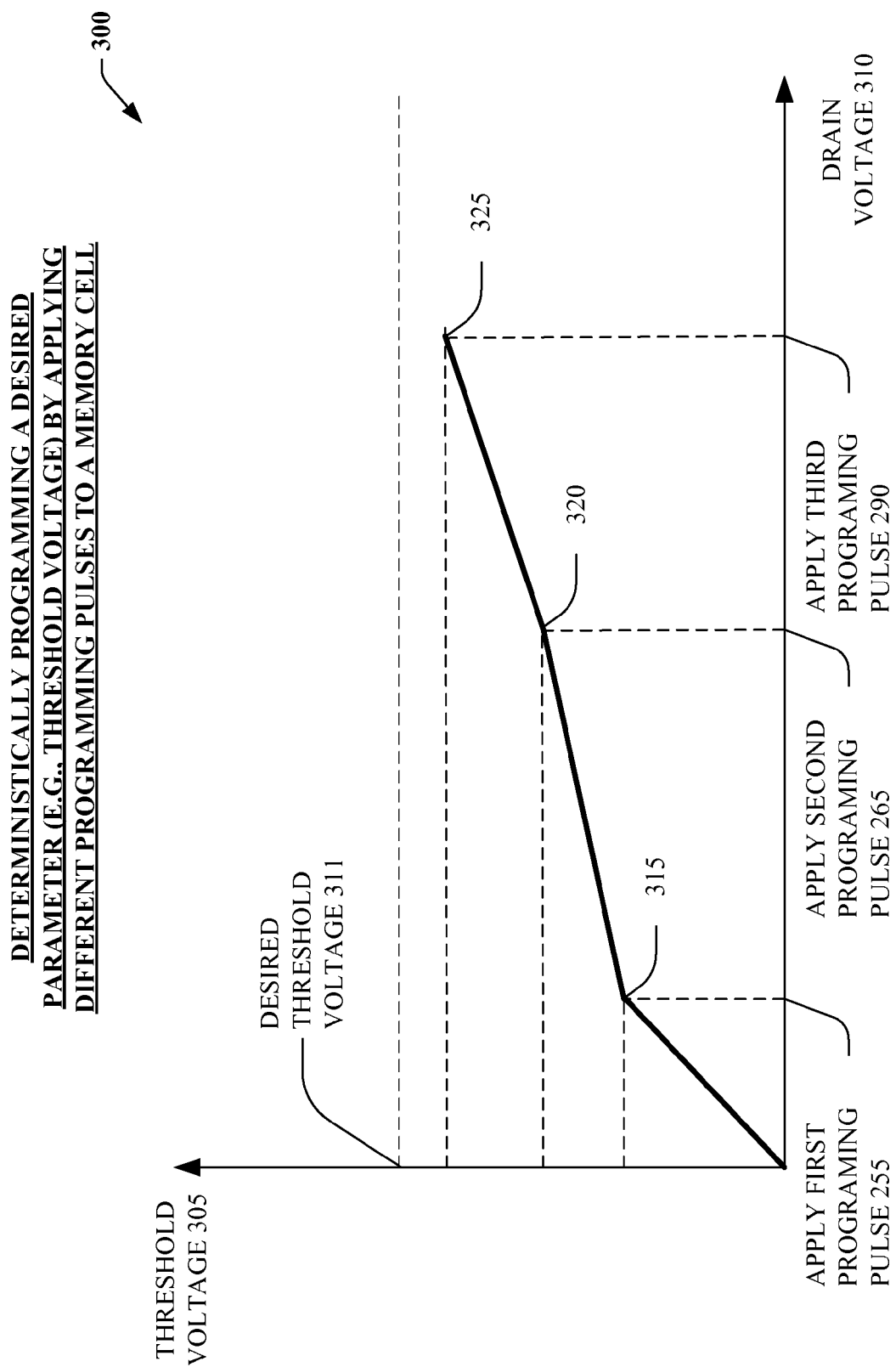
FIG. 3 is a plot illustrating deterministically programming a memory cell parameter (e.g., threshold voltage) by applying different programming pulses to the memory cell, in accordance with an embodiment of the invention.

FIG. 3 is a plot illustrating process 200 deterministically programming a memory cell parameter (e.g., threshold voltage) by applying different programming pulses to the memory cell, in accordance with an embodiment of the invention. The characteristic of the memory cell measured after applying the first and second programming pulses is the threshold voltage of the memory cell, in accordance with an embodiment of the invention. The plot 300 illustrates a threshold voltage 305 on the y-axis and a drain voltage 310 on the x-axis. The desired threshold voltage 311 is plotted as the top-most horizontal dashed line on plot 300.

At a reference point 315, the first programming pulse of process block 255 is applied to the drain of the memory cell, and the first value of the threshold voltage of the memory cell is measured at process block 260. At a reference point 320, the second programming pulse of process block 265 is applied to the drain of the memory cell, and the second value of the threshold voltage of the memory cell is measured at process block 270. The third programming pulse is calculated at process block 280 (based on the first and second values of the threshold voltage that were measured) and the third programming pulse of process block 290 is applied to the drain of the memory cell at a reference point 325. Unlike conventional, programming systems and methods that result in varied memory cell distribution and over programming, the subject invention reduces or eliminates over programming and tightens memory cell distributions by iteratively converging on a desired programmed parameter value for each memory cell of a memory device.

Figure 4:
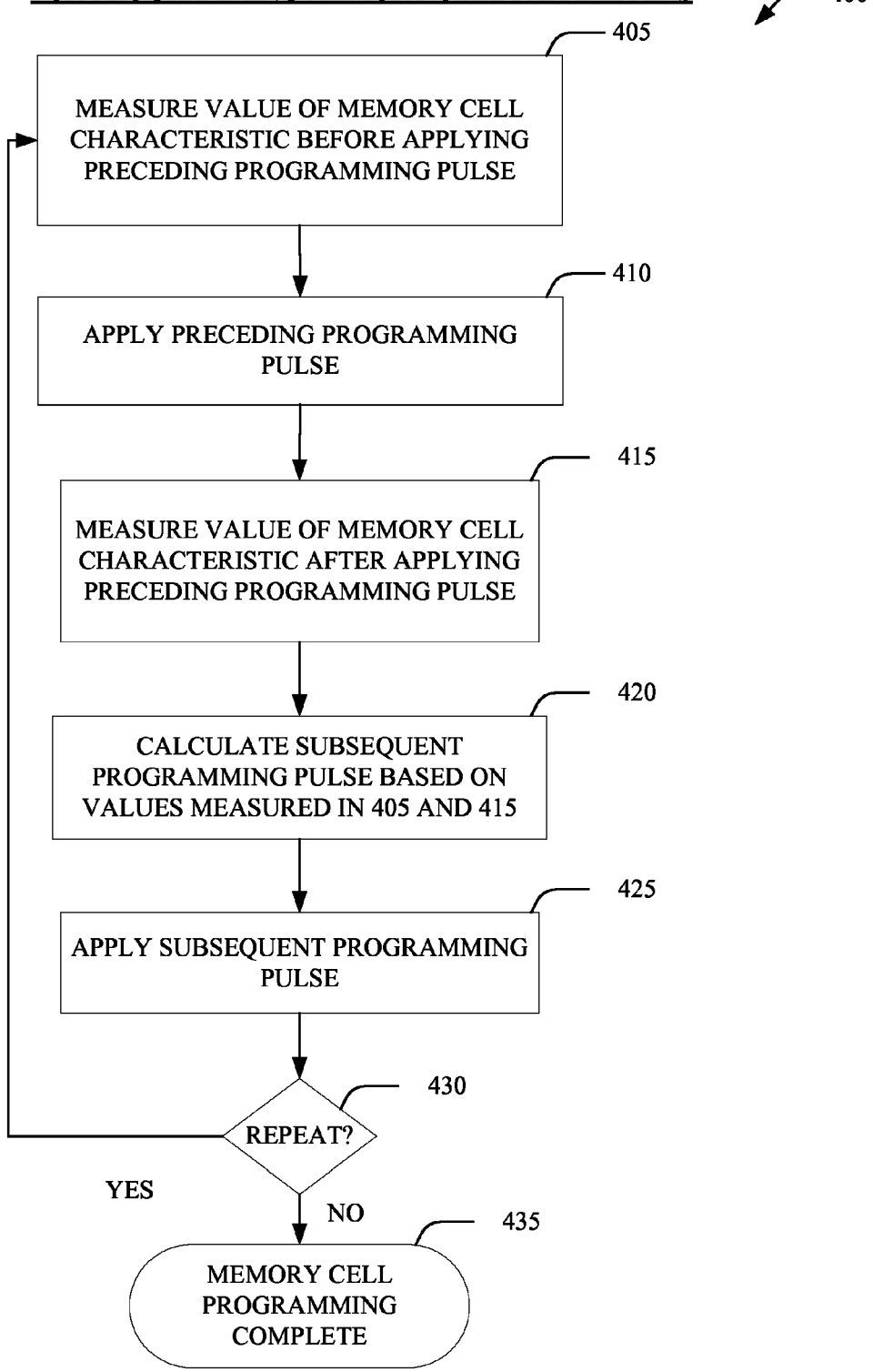
FIG. 4 is a flow chart illustrating a process for increasing the accuracy of deterministically programming memory cell parameters, in accordance with an embodiment of the invention.

FIG. 4 is a flow chart illustrating a process 400 for increasing the accuracy of deterministically programming memory cell parameters, in accordance with an embodiment of the invention. In a process block 405, analysis component 115 can measure value(s) of one or more memory cell characteristics before pulse component 105 applies a preceding pulse (e.g., the second value of the characteristic of the memory cell can be measured at process block 270 before applying the third programming pulse at process 290). In a process block 410, the pulse component 105 can apply the preceding programming pulse to the memory cell. Process 400 then continues to a process block 415, in analysis component 115 can measure value(s) of one or more memory cell characteristics after pulse component 105 applied the preceding programming pulse (e.g., the third value of the characteristic of the memory cell can be measured after applying the third programming pulse at process 290). Process 400 then continues to a process block 420, in which computation component 120 can calculate a subsequent programming pulse, based on the value(s) of the one or more characteristics of the memory cell measured at process blocks 405 and 415.

In a process block 425, pulse component 105 can apply the subsequent programming pulse, different from the preceding programming pulse, to the memory cell. In accordance with one embodiment, pulse component 105 can vary the magnitude of the voltage of the preceding and subsequent programming pulses as a function of the measured values of a characteristic of the memory cell. In other embodiments, pulse component 105 can vary the magnitude of the pulse current, electric field, width, and/or shape (i.e., over time) of the preceding and subsequent programming pulses as a function of the measured values of a characteristic of a memory cell. However, it should be appreciated that the programming pulses can differ in any way. Further, in accordance with one embodiment, the programming pulses can be applied to the drain of the memory cell. In other embodiments, the programming pulses can be applied to the gate or source of the memory cell. However, it should be appreciated that the programming pulses can be applied to any part of the memory cell.

Figure 5:
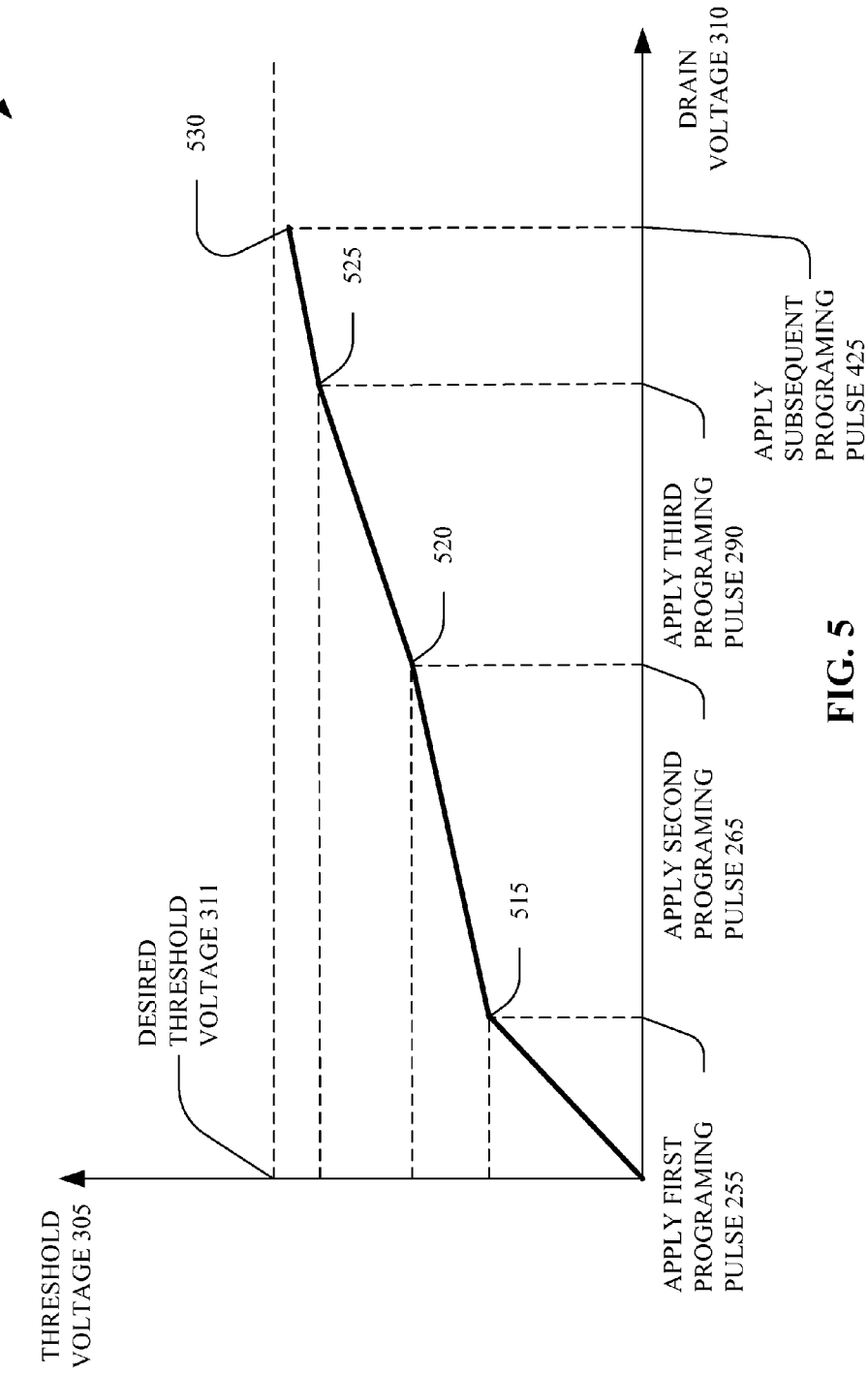
FIG. 5 is a plot illustrating increasing the accuracy of deterministically programming memory cell parameters (e.g., threshold voltage) by applying more than three different programming pulses to a memory cell, in accordance with an embodiment of the invention.

Process 400 then continues to a decision block 430, in which it can be decided whether to repeat process 400. It should be understood by a person of ordinary skill in the art having the benefit of the instant disclosure that continuing process 400 will iteratively converge to the desired programmed parameter, and the more that process 400 repeats, the more closely a subsequent programming pulse will converge to the desired programmed parameter. FIG. 5 is a plot 500 illustrating increasing the accuracy of deterministically programming memory cell parameters (e.g., threshold voltage) by applying more than three different programming pulses to a memory cell, in accordance with an embodiment of the invention. The characteristic of the memory cell measured before and after applying the preceding programming pulse is threshold voltage, in accordance with an embodiment of the invention. The plot 500 illustrates threshold voltage 305 on the y-axis and drain voltage 310 on the x-axis. The desired threshold voltage 311 is plotted as the top-most horizontal dashed line on plot 500. At a reference point 515, the first programming pulse of process block 255 is applied to the drain of the memory cell, and the first value of the threshold voltage of the memory cell is measured at process block 260.

At a reference point 520, the second programming pulse of process block 265 is applied to the drain of the memory cell, and the second value of the threshold voltage of the memory cell is measured at process block 270 (e.g., a value of the memory cell characteristic is measured at process block 405). At reference point 525, the third programming pulse is calculated at process block 280 (based on the first and second values of the threshold voltage that were measured), the third programming pulse of process block 290 is applied to the drain of the memory cell, and a value of threshold voltage is measured at process block 415. At reference point 530, a subsequent programming pulse is calculated (based on the values of threshold voltage measured at process blocks 405 and 415), and the subsequent programming pulse is applied at process block 425. As illustrated by plots 300 and 500, the value of threshold voltage programmed converged more closely to the desired threshold voltage 311 when a subsequent programming pulse at process block 425 was applied. By iteratively converging on a desired programmed parameter, the subject invention tightens memory cell distributions and reduces or illuminates over programming.

Figure 6:
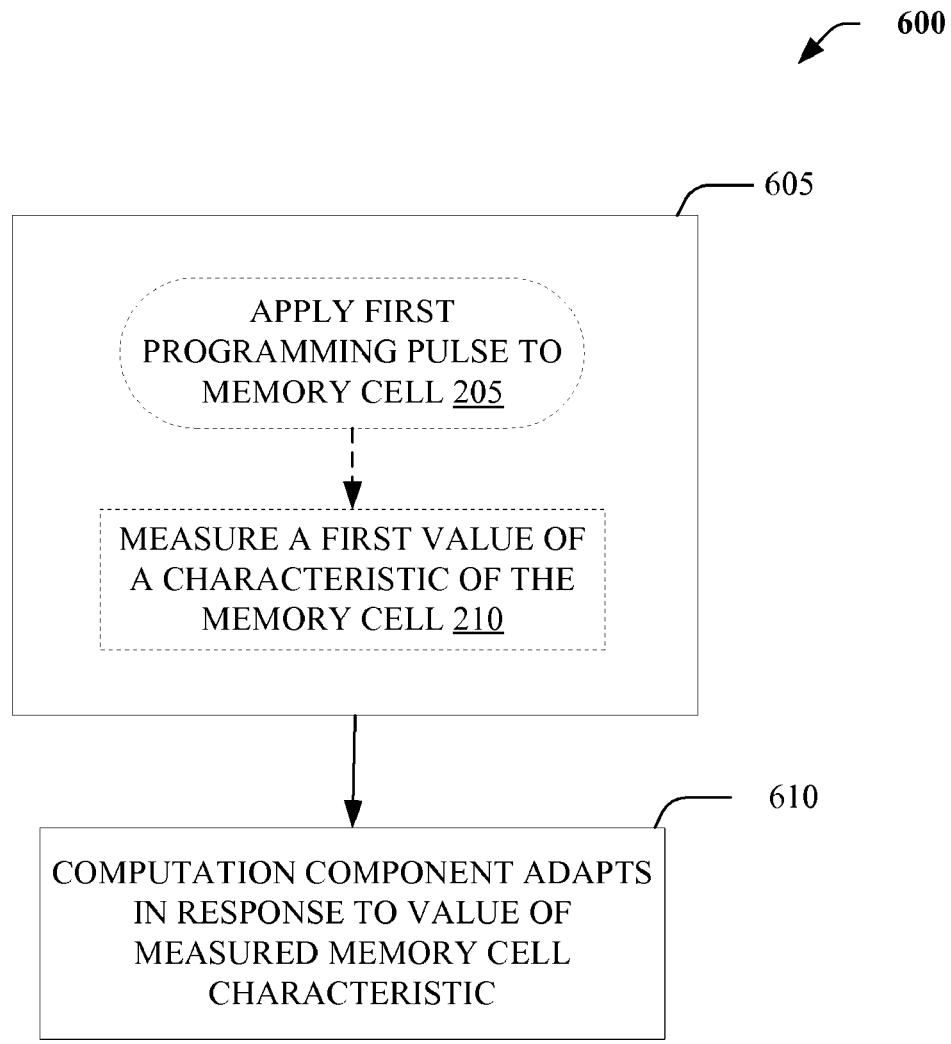
FIG. 6 is a flow chart illustrating a computation component adaptive to a measured value of a memory cell characteristic, in accordance with an embodiment of the invention.

FIG. 6 is a flow chart illustrating a process 600 in which a computation component is adaptive to a measured value of a memory cell characteristic, in accordance with an embodiment of the invention. In a process block 605, pulse component 105 can apply a programming pulse to a memory cell, and analysis component 115 can measure values of one or more characteristics of the memory cell. In accordance with one embodiment, the value of a characteristic of the memory cell measured by analysis component 115 can be the first value of the memory cell characteristic measured at process block 260. In other embodiments, the value of the characteristic of the memory cell measured can be the second value of the memory cell characteristic measured at process block 270, or the value of the memory cell characteristic measured at process block 405. Process 600 then continues to a process block 610, in which the computation component 120 can be modified based on the value of the memory cell characteristic measured at process block 605. In one embodiment, an algorithm of the computation component is modified in response to a measured value of the memory cell characteristic. However, it should be appreciated that the computation component can be modified in any way, and in response to any measured value of one or more memory cell characteristics.

Figure 7:
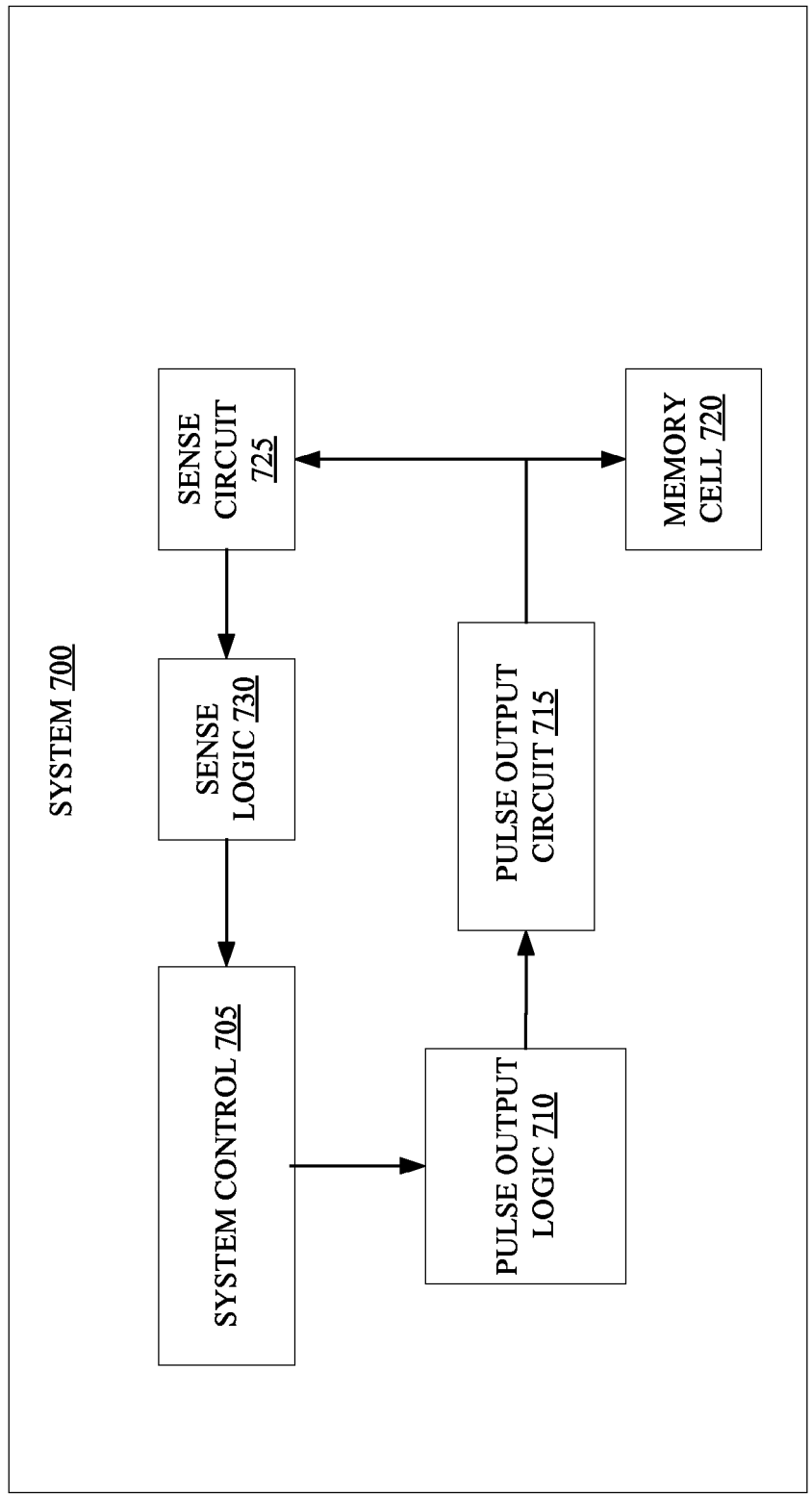
FIG. 7 is a demonstrative system for deterministically programming memory cell parameters, in accordance with an embodiment of the invention.

FIG. 7 is a block diagram illustrating a demonstrative system 700 for deterministically programming memory cell parameters, in accordance with an embodiment of the invention. A system control block 705 can receive input from a sense logic block 730 and can control a pulse output logic block 710. System control block 705 may include a computer that contains a central processing unit for making computations and performing various program and data transfers, and may also contain memory for program and data storage.

Pulse output logic block 710 can receive information from system control block 705, and may include decode logic that decodes the information received from system control block 705 to control pulse output circuit block 715. Pulse output logic block 710 may also include look-up tables that store information received from system control block 705. Pulse output circuit block 715 can receive control logic from pulse output logic block 710 and can translate the control logic into voltage and/or current that is applied to a memory cell 720. The voltage generated by pulse output circuit block 715 may be high voltage.

Memory cell 720 may be a flash memory cell (e.g., single-bit flash memory, multi-bit flash memory) that includes at least one of a NOR flash memory or a NAND flash memory. Sense circuit block 725 can receive voltage and current generated by memory cell 720, and can transmit signals to sense logic block 730. Sense circuit block may include multiple static references, comparators, and any other elements that comprise sense circuits. Sense logic block 730 can receive signals sent by sense circuit block 725 and can translate the signals into logic that can be received by system controller 705. Sense logic 730 may translate the signals using encoding logic. It should be understood by a person of ordinary skill in the art having the benefit of the instant disclosure that system 700 may comprise any hardware and/or software necessary to perform the above illustrated embodiments of the invention.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events.

Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., CD, DVD . . . ), smart cards, and flash memory devices (e.g., card, stick, key drive . . . ).

Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter. Moreover, the word "exemplary" is used herein to mean serving as an example, instance, or illustration. Any aspect or design described herein as "exemplary" is not necessarily to be construed as preferred or advantageous over other aspects or designs.

Figure 8:
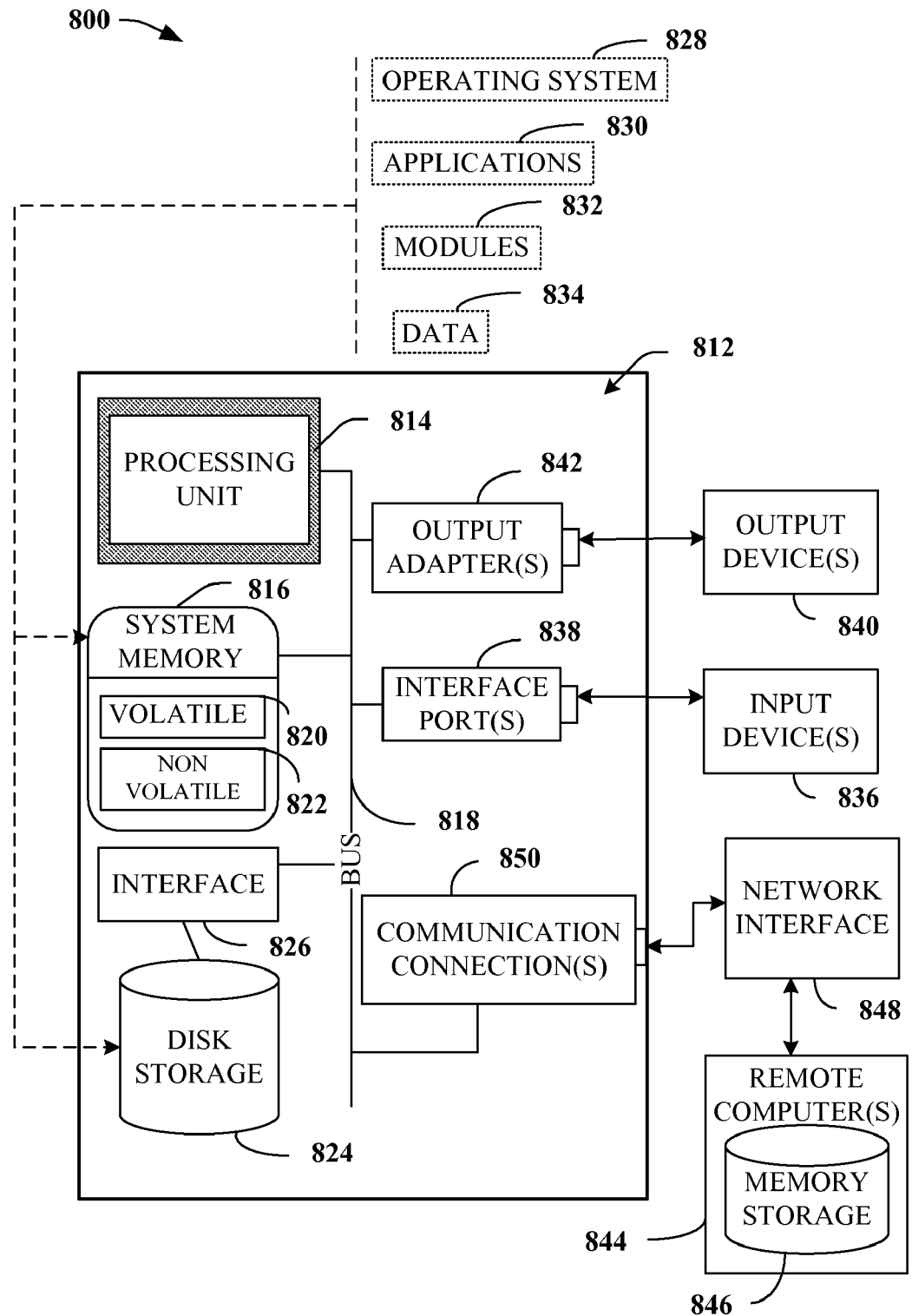
FIG. 8 is schematic block diagram illustrating a suitable operating environment.
Figure 9:
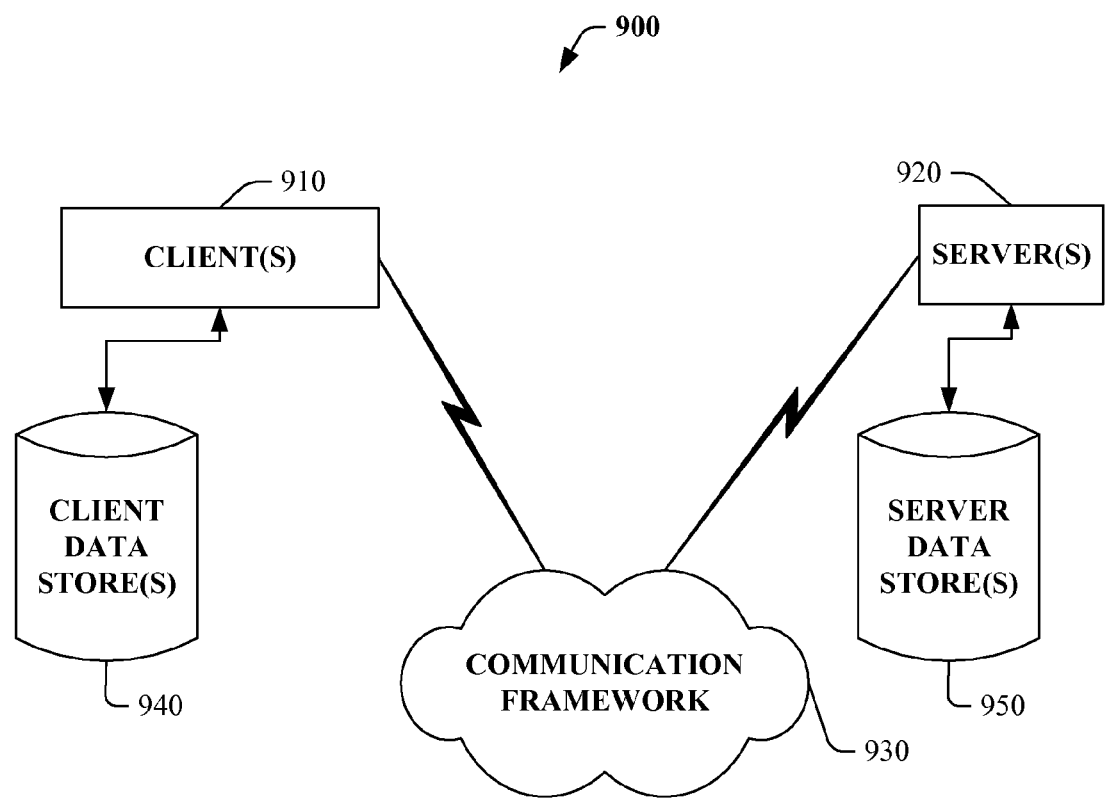
FIG. 9 is a schematic block diagram of a sample-computing environment.
Figure 10:
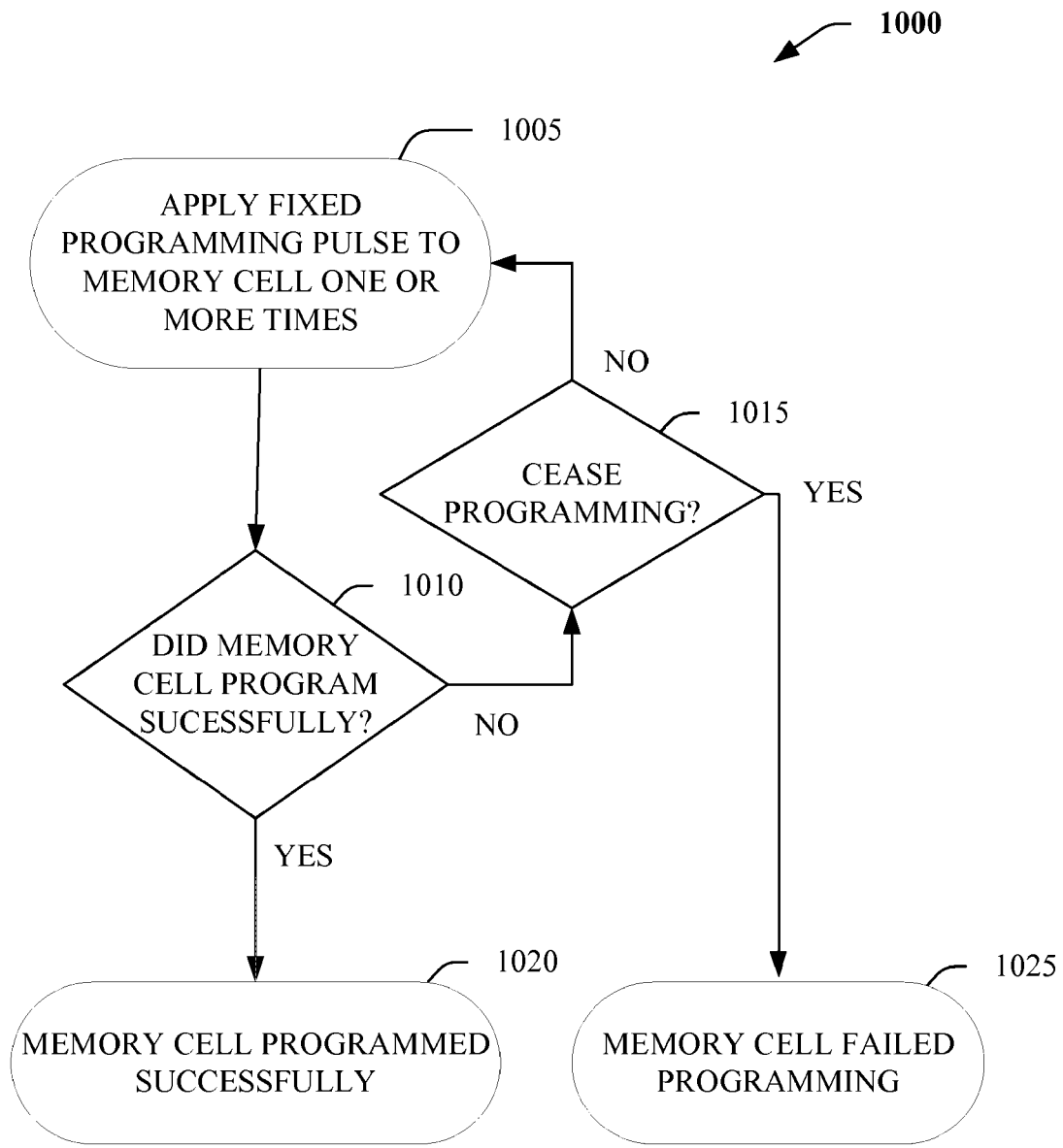
FIG. 10 illustrates a conventional method for programming memory cell parameters.

In order to provide a context for the various aspects of the disclosed subject matter, FIGS. 8 and 9, as well as the following discussion, are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types.

Moreover, those skilled in the art will appreciate that the inventive systems may be practiced with other computer system configurations, including single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 8, a suitable environment 800 for implementing various aspects of the claimed subject matter includes a computer 812. The computer 812 includes a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814.

The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 816 includes volatile memory 820 and nonvolatile memory 822. The basic input/output system (BIOS), containing the basic routines to transfer information between elements within the computer 812, such as during start-up, is stored in nonvolatile memory 822. By way of illustration, and not limitation, nonvolatile memory 822 can include ROM, PROM, EPROM, EEPROM, or flash memory. Volatile memory 820 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ES-DRAM), Synchlink DRAM (SLDRAM), Rambus direct RAM (RDRAM), direct Rambus dynamic RAM (DRDRAM), and Rambus dynamic RAM (RDRAM).

Computer 812 also includes removable/non-removable, volatile/non-volatile computer storage media. FIG. 8 illustrates, for example, a disk storage 824. Disk storage 824 includes, but is not limited to, devices like a magnetic disk drive, floppy disk drive, tape drive, Jaz drive, Zip drive, LS-100 drive, flash memory card, or memory stick. In addition, disk storage 824 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 824 to the system bus 818, a removable or non-removable interface is typically used, such as interface 826.

It is to be appreciated that FIG. 8 describes software that acts as an intermediary between users and the basic computer resources described in the suitable operating environment 800. Such software includes an operating system 828. Operating system 828, which can be stored on disk storage 824, acts to control and allocate resources of the computer system 812. System applications 830 take advantage of the management of resources by operating system 828 through program modules 832 and program data 834 stored either in system memory 816 or on disk storage 824. It is to be appreciated that the disclosed subject matter can be implemented with various operating systems or combinations of operating systems.

A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836.

Thus, for example, a USB port may be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a personal computer, a server, a router, a network PC, a workstation, a microprocessor based appliance, a peer device or other common network node and the like, and typically includes many or all of the elements described relative to computer 812.

For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 850 refer(s) to the hardware/software employed to connect the network interface 848 to the bus 818. While communication connection 850 is shown for illustrative clarity inside computer 812, it can also be external to computer 812. The hardware/software necessary for connection to the network interface 848 includes, for exemplary purposes only, internal and external technologies such as, modems including regular telephone grade modems, cable modems and DSL modems, ISDN adapters, and Ethernet cards.

FIG. 9 is a schematic block diagram of a sample-computing environment 900 with which the subject innovation can interact. The system 900 includes one or more client(s) 910. The client(s) 910 can be hardware and/or software (e.g., threads, processes, computing devices). The system 900 also includes one or more server(s) 920. Thus, system 900 can correspond to a two-tier client server model or a multi-tier model (e.g., client, middle tier server, data server), amongst other models. The server(s) 920 can also be hardware and/or software (e.g., threads, processes, computing devices). The servers 920 can house threads to perform transformations by employing the subject innovation, for example. One possible communication between a client 910 and a server 920 may be in the form of a data packet transmitted between two or more computer processes.

The system 900 includes a communication framework 930 that can be employed to facilitate communications between the client(s) 910 and the server(s) 920. The client(s) 910 are operatively connected to one or more client data store(s) 940 that can be employed to store information local to the client(s) 910. Similarly, the server(s) 920 are operatively connected to one or more server data store(s) 950 that can be employed to store information local to the servers 920.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art should recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A system comprising:
a pulse component that applies different programming pulses to a memory cell;
an analysis component that measures values of one or more characteristics of the memory cell as a function of the applied different programming pulses;
a computation component that computes the applied different programming pulses as a function of the measured values of the one or more characteristics of the memory cell; and
a data store component that stores information,
wherein the computation component computes the applied different programming pulses as a function of the stored information.

2. The system of claim 1, wherein the stored information comprises at least one of a value of a threshold voltage, current, gain, change in threshold voltage, resistance, impedance, or change in current.

3. The system of claim 1, wherein the data store component comprises at least one of a look up table or calculation component.

4. The system of claim 3, wherein the stored information comprises at least one of a value of a threshold voltage, current, gain, electric field, body effect, change in threshold voltage, resistance, impedance, inductance, temperature coefficient, or change in current.

5. The system of claim 3, further comprising an artificial intelligence component that automatically generates the applied different programming pulses.

6. The system of claim 1, wherein the analysis component measures first values of the one or more characteristics of the memory cell, wherein the computation component computes a first programming pulse as a function of the measured first values of the one or more characteristics of the memory cell, and wherein the pulse component applies the first programming pulse to the memory cell.

7. The system of claim 6, wherein the analysis component measures one or more subsequent values of the one or more characteristics of the memory cell, wherein the computation component computes one or more subsequent programming pulses as a function of the measured one or more subsequent values of the one or more characteristics of the memory cell, and wherein the pulse component applies the one or more subsequent programming pulses to the memory cell.

8. The system of claim 1, wherein the analysis component measures first values of the one or more characteristics of the memory cell as a function of a first applied programming pulse and measures second values of the one or more characteristics of the memory cell as a function of a second applied programming pulse, wherein the computation component computes a third programming pulse as a function of the measured first and second values of the one or more characteristics of the memory cell, and wherein the pulse component applies the third programming pulse to the memory cell.

9. The system of claim 8, wherein the pulse component applies one or more subsequent programming pulses to the memory cell, wherein the analysis component measures subsequent values of the one or more characteristics of the memory cell as a function of the one or more subsequent programming pulses applied to the memory cell, and wherein the computation component computes the one or more subsequent programming pulses as a function of the measured subsequent values of the one or more characteristics of the memory cell.

10. The system of claim 1, wherein the computation component comprises an algorithm that computes the applied different programming pulses as a function of the measured values of the one or more characteristics of the memory cell.

11. The system of claim 10, wherein the algorithm is modified as a function of the measured values of the one or more characteristics of the memory cell.

12. The system of claim 1, wherein the memory cell comprises at least one of a NOR flash memory, a NAND flash memory, other non-volatile memory, or a combination thereof.

13. A machine-readable medium that provides instructions that, if executed by a machine, will cause the machine to perform operations comprising:
applying different programming pulses to a memory cell;
measuring values of one or more characteristics of the memory cell as a function of the applied different programming pulses; and
computing the applied different programming pulses as a function of the measured values of the one or more characteristics of the memory cell; and
further comprising
instructions that, if executed by a machine, will cause the machine to perform operations comprising:
modifying an algorithm that computes the applied different programming pulses, wherein the algorithm is modified as a function of the measured values of the one or more characteristics of the memory cell.

14. The machine-readable medium of claim 13, further comprising instructions that, if executed by a machine, will cause the machine to perform operations comprising:
storing information in a data store component;
computing the applied different programming pulses as a function of the stored information; and
automatically generating the applied different programming pulses.

15. The machine-readable medium of claim 13, further comprising instructions that, if executed by a machine, will cause the machine to perform operations comprising:
measuring first values of the one or more characteristics of the memory cell;
computing a first programming pulse as a function of the measured first values of the one or more characteristics of the memory cell;
applying the first programming pulse to the memory cell;
measuring one or more subsequent values of the one or more characteristics of the memory cell;
computing one or more subsequent programming pulses as a function of the measured one or more subsequent values of the one or more characteristics of the memory cell; and
applying the one or more subsequent programming pulses to the memory cell.

16. The machine-readable medium of claim 13, further comprising instructions that, if executed by a machine, will cause the machine to perform operations comprising:
measuring first values of the one or more characteristics of the memory cell as a function of a first applied programming pulse;
measuring second values of the one or more characteristics of the memory cell as a function of a second applied programming pulse;
computing a third programming pulse as a function of the measured first and second values of the one or more characteristics of the memory cell; and
applying the third programming pulse to the memory cell.

17. The machine-readable medium of claim 16, further comprising instructions that, if executed by a machine, will cause the machine to perform operations comprising:
applying one or more subsequent programming pulses to the memory cell;
measuring subsequent values of the one or more characteristics of the memory cell as a function of the one or more subsequent programming pulses applied to the memory cell; and
computing the subsequent programming pulses as a function of the measured subsequent values of the one or more characteristics of the memory cell.

18. The machine-readable medium of claim 13 in a form of nonvolatile memory.

19. A system comprising:
a means for applying different programming pulses to a memory cell;
a means for measuring values of one or more characteristics of the memory cell as a function of the applied different programming pulses;
a means for computing the applied different programming pulses as a function of the measured values of the one or more characteristics of the memory cell;
a means for storing information;
a means for computing the applied different programming pulses as a function of the stored information;
a means for automatically generating the applied different programming pulses; and
a means for modifying an algorithm that computes the applied different programming pulses.

20. The system of claim 19, further comprising:
means for measuring first values of the one or more characteristics of the memory cell;
means for computing a first programming pulse as a function of the measured first values of the one or more characteristics of the memory cell;
means for applying the first programming pulse to the memory cell;
means for measuring one or more subsequent values of the one or more characteristics of the memory cell;
means for computing one or more subsequent programming pulses as a function of the measured one or more subsequent values of the one or more characteristics of the memory cell; and
applying the one or more subsequent programming pulses to the memory cell.

* * * * *